(12) United States Patent
Gyoda et al.

(10) Patent No.: US 8,839,169 B2
(45) Date of Patent: Sep. 16, 2014

(54) PATTERN DETERMINING METHOD, PATTERN DETERMINING APPARATUS AND STORAGE MEDIUM

(71) Applicant: Canon Kabushiki Kaisha, Tokyo (JP)

(72) Inventors: Yuichi Gyoda, Utsunomiya (JP); Koji Mikami, Nikko (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/685,791

(22) Filed: Nov. 27, 2012

(65) Prior Publication Data
US 2013/0149636 A1   Jun. 13, 2013

(30) Foreign Application Priority Data
Dec. 7, 2011  (JP) .................................. 2011-268368

(51) Int. Cl.
  *G06F 17/50*  (2006.01)
  *G03F 1/70*  (2012.01)
(52) U.S. Cl.
  CPC . *G03F 1/70* (2013.01); *G06F 17/50* (2013.01)
  USPC ............................................ 716/111; 716/55
(58) Field of Classification Search
  USPC ................................................... 716/55, 111
  See application file for complete search history.

(56) References Cited

U.S. PATENT DOCUMENTS

| 6,014,455 | A | 1/2000 | Sumiyoshi et al. |
| 6,792,592 | B2 | 9/2004 | Keogan et al. |
| 6,931,617 | B2 | 8/2005 | Sanie et al. |
| 8,390,781 | B2 * | 3/2013 | Laidig .............................. 355/53 |
| 2011/0107277 | A1 | 5/2011 | Tsujita et al. |

* cited by examiner

*Primary Examiner* — Thuan Do
(74) *Attorney, Agent, or Firm* — Fitzpatrick, Cella, Harper & Scinto

(57) ABSTRACT

A method of determining a pattern of a mask to be used in an exposure apparatus. The mask is arranged on an object plane of a projection optical system. The method includes calculating a value of a first evaluation function used to evaluate a cost of drawing a provisional pattern on a mask blank to manufacture the mask, calculating a value of a second evaluation function used to evaluate an image of the provisional pattern, which is formed on an image plane of the projection optical system when a mask having the provisional pattern is arranged on the object plane, and changing the provisional pattern. The calculations are repeated, and the provisional pattern is determined as the pattern of the mask, when the value of the first evaluation function meets a first predetermined standard and the value of the second evaluation function meets a second predetermined standard.

9 Claims, 14 Drawing Sheets

FIG. 17

| CONDITION | MASK ERROR | FOCUS DETECTION ERROR | EXPOSURE AMOUNT ERROR |
|---|---|---|---|
| 1 | 0 | 0 | 0 |
| 2 | +0.5nm | 0 | 0 |
| 3 | -0.5nm | 0 | 0 |
| 4 | 0 | +40nm | 0 |
| 5 | 0 | -40nm | 0 |
| 6 | 0 | 0 | +3% |
| 7 | 0 | 0 | -3% |

PATTERN DETERMINING METHOD, PATTERN DETERMINING APPARATUS AND STORAGE MEDIUM

This application claims the benefit of Japanese Patent Application No. 2011-268368, filed Dec. 7, 2011 which is hereby incorporated by reference herein in its entirety.

BACKGROUND OF THE INVENTION

1. Field of the Invention

The present invention relates to a pattern determining method, a pattern determining apparatus, and a non-transitory computer-readable storage medium storing a program that causes a computer to execute the method.

2. Description of the Related Art

In a lithography step of manufacturing a device such as a semiconductor device, an exposure apparatus is used to form a device pattern on a substrate. The exposure apparatus includes a projection optical system. The projection optical system projects a pattern of a mask (reticle) arranged on its object plane onto a substrate. The mask is made by undergoing a step of causing a drawing apparatus to draw, on a mask blank, a pattern to be formed on the mask blank. Examples of the drawing apparatus are an electron-beam exposure apparatus that uses an electron beam as a drawing beam, and a laser drawing apparatus that uses a laser beam as a drawing beam. A mask for the manufacture of a front-end semiconductor device is often manufactured using the electron-beam exposure apparatus.

Major drawing methods of the electron-beam exposure apparatus are a raster method and a VSB (Variable-Shaped Beam) method. In the raster method, a pattern is drawn while raster-scanning the entire surface of a mask blank. In the VSB method, an electron beam having an area larger than that in the raster method is generated. The electron beam is shielded by an aperture to form a rectangular drawing shot having an area corresponding to a pattern to be drawn, and the pattern is drawn using the drawing shot. Note that the drawing shot means a region of a mask blank exposed by irradiating the mask blank with a drawing beam (electron beam) once.

There is employed a technique of adjusting a mask pattern shape using a computer. Examples of the technique are OPC (Optical Proximity Correction) and ILT (Inverse Lithography Technology). As the patterns for devices become finer, a pattern having undergone OPC or a pattern calculated by an algorithm based on ILT can become complicated because of, for example, inclusion of curved portions.

A pattern determined by calculation cannot directly be drawn on a mask blank by, for example, a VSB drawing apparatus. The pattern needs to be divided into a plurality of drawing shots or parts (mainly, rectangles). This operation is called fracturing, and software therefor is commercially available. However, when fracturing is performed for a complex pattern, the number of generated drawing shots may explosively increase, or the drawing shot size may be excessively small. The larger the number of drawing shots is, the longer the operation time of the drawing apparatus for drawing a pattern on one mask blank is, resulting in an increase in the mask cost. Additionally, the smaller the drawing shot size is, the higher is the accuracy required to control the drawing position or drawing dose (intensity) of the drawing apparatus. This results in a decrease in the yield rate of mask manufacture, and a need for a front-end drawing apparatus may emerge to improve the yield rate. For these reasons, the masks have become very expensive in recent years, posing a serious problem in the semiconductor industry.

A raster drawing apparatus can also cause errors in the beam position or intensity due to a factor (for example, a factor caused by aberration) according to the scanning position of an electron beam. In addition, the smaller the individual pattern size is, the higher is the accuracy required to control the beam position or intensity. This may lower the yield rate of masks or the throughput of mask manufacture. Hence, a complex mask pattern results in an increase in the mask cost, as a matter of course.

U.S. Patent Application Publication No. 2011/0107277 (the '277 publication) discloses a method of parameterizing a mask pattern to determine (optimize) the mask pattern into a simple shape. The '277 publication also discloses a method of parameterizing an illumination shape to optimize the illumination shape together with the mask pattern. This is an example of a technique called SMO (Source Mask Optimization). Using the method of the '277 publication provides the ability to optimize a mask pattern into a rectangular shape simpler than in OPC or ILT. The '277 publication, however, does not consider the cost when drawing a pattern using a drawing apparatus at all.

U.S. Pat. No. 6,792,592 discloses an OPC method considering the characteristics of a drawing apparatus. However, this method only executes OPC using the characteristics of a drawing apparatus as constraint conditions, and cannot determine the mask drawing condition. In addition, the method of U.S. Pat. No. 6,792,592 only executes OPC as a means for improving the accuracy of a transfer position on a wafer. Since image characteristics when a mask pattern is transferred to a water are not taken into consideration, it is difficult to regard the method as being capable of providing a reliable mask pattern.

U.S. Pat. No. 6,931,617 discloses a method of determining a layout in consideration of the mask cost. In the '617 patent, however, the cost is only considered when integrating a plurality of cell libraries (logic circuit blocks) input in advance. Hence, the method neither optimizes a mask pattern nor considers the performance of an image on a wafer.

The fracturing method as a general technique only divides an input mask pattern into a plurality of shots, and cannot optimize the mask pattern shape itself.

SUMMARY OF THE INVENTION

The present invention provides a technique advantageous in improving the efficiency of mask manufacturing.

One of the aspects of the present invention provides a method of determining a pattern of a mask to be used in an exposure apparatus that includes a projection optical system, wherein the mask is arranged on an object plane of the projection optical system, the method comprising the following steps being executed by a computer: a first calculation step of calculating a value of a first evaluation function used to evaluate a cost of drawing a provisional pattern on a mask blank to manufacture the mask, a second calculation step of calculating a value of a second evaluation function used to evaluate an image formed on an image plane of the projection optical system when a mask having the provisional pattern is arranged on the object plane of the projection optical system, and a changing step of, when a calculation result of the first calculation step and a calculation result of the second calculation step do not meet a termination condition, changing at least one of the provisional pattern, an illumination condition in the exposure apparatus, and a drawing condition of the pattern for the mask blank, wherein the first calculation step and the second calculation step are repeated via the changing step until the calculation results meet the termination condition, and when the calculation results meet the termination condition, a latest provisional pattern is determined as the pattern of the mask.

Further features of the present invention will become apparent from the following description of exemplary embodiments with reference to the attached drawings.

BRIEF DESCRIPTION OF THE DRAWINGS

FIG. 17 is a table showing conditions in an exposure simulation.

DESCRIPTION OF THE EMBODIMENTS

Figure 16:
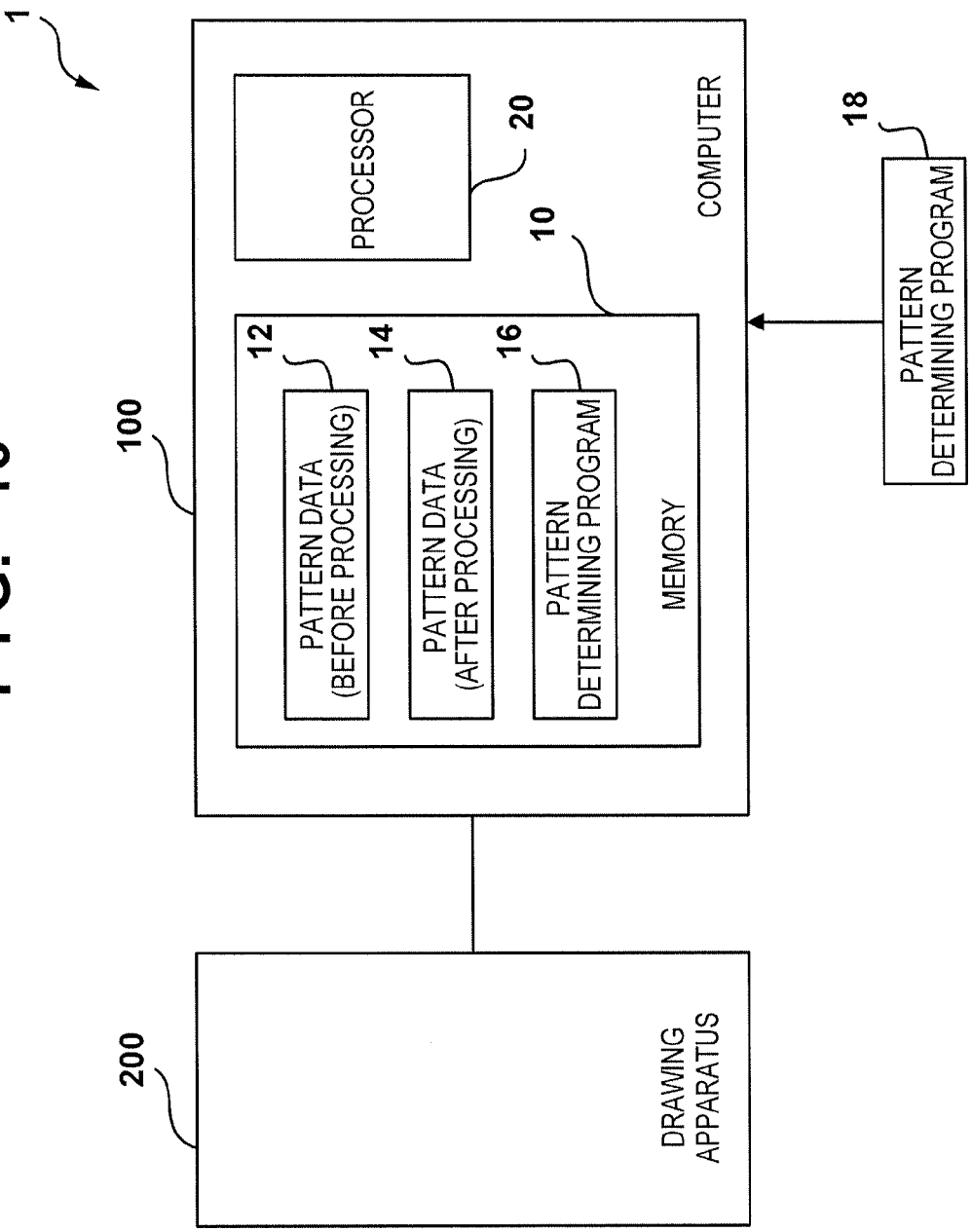
FIG. 16 is a block diagram showing the arrangement of a pattern drawing system (mask manufacturing system) according to the embodiment of the present invention.

The embodiments of the present invention will now be described with reference to the accompanying drawings. FIG. 16 is a block diagram showing the arrangement of a pattern drawing system (mask manufacturing system) 1 according to an embodiment of the present invention. The pattern drawing system 1 can include a computer 100 constituted as a pattern determining apparatus, and a drawing apparatus 200. The computer 100 includes a memory 10, and a processor 20. A pattern determining program 18 stored in a non-transitory computer-readable storage medium can be installed in the computer 100. More specifically, the computer 100 reads out the pattern determining program 18 stored in the storage medium and stores it in the memory 10 as a pattern determining program 16. The computer 100 operates as a pattern determining apparatus for executing a pattern determining method in accordance with the pattern determining program 16. The computer 100 that operates as a pattern determining apparatus processes pattern data 12 representing a pattern to be formed on a substrate, and generates pattern data 14 representing a pattern to be drawn on a mask blank to manufacture a mask.

The drawing apparatus 200 draws a pattern on a mask blank based on the pattern data 14 generated by the computer 100. A photoresist is applied to the mask blank. When the pattern is drawn on the mask blank, a latent image is formed on the photoresist. The mask blank with the pattern being drawn on it is developed, thereby obtaining a mask having a physical pattern. The thus formed mask is arranged on the object plane of the projection optical system of an exposure apparatus in a lithography step of manufacturing a device such as a semiconductor device. The mask arranged on the object plane in the exposure apparatus is illuminated by an illumination system in a set illumination mode. The pattern of the mask is projected onto a substrate via the projection optical system, and the substrate is exposed accordingly.

The pattern determining method executed by the computer 100 determines a pattern of the mask to be used in the exposure apparatus. The mask is arranged on the object plane of the projection optical system. The pattern determining method includes a first calculation step, a second calculation step, a judging step, a determining step, and a changing step. Typically, the pattern data 14 as a resultant product is generated from the input pattern data 12 by optimization calculation. In the first calculation step, the value of a first evaluation function used to evaluate the cost of drawing a provisional pattern on a mask blank to manufacture a mask is calculated. In the second calculation step, the value of a second evaluation function used to evaluate an image formed on the image plane of the projection optical system when the mask having the provisional pattern is arranged on the object plane of the projection optical system is calculated. In the judging step, when the calculation results of the first calculation step and the second calculation step do not meet a termination condition, at least one of the provisional pattern, the illumination condition of the exposure apparatus, and the drawing condition of the pattern for the mask blank is changed. In this pattern determining method, until it is judged in the judging step that the calculation results of the first calculation step and the second calculation step for the provisional pattern meet the termination condition, the first calculation step and the second calculation step are repeated via the changing step. When the calculation results meet the termination condition, the latest provisional pattern is determined as the pattern of the mask.

The cost of drawing a provisional pattern on a mask blank to manufacture a mask can be, for example, the number of drawing shots necessary for drawing a pattern on the mask blank. Another example of the cost is a time necessary for drawing a pattern on the mask blank.

"Provisional pattern" is an expedient expression for the sake of discrimination from a pattern to be finally determined by the pattern determining method. No technical difference exists between a "provisional pattern" and a "pattern". For example, when the value of the first evaluation function is being calculated, and when the value of the second evaluation function is being calculated, the pattern is not determined yet. Hence, the pattern at those points of time is expressed as a "provisional pattern".

Figure 1:
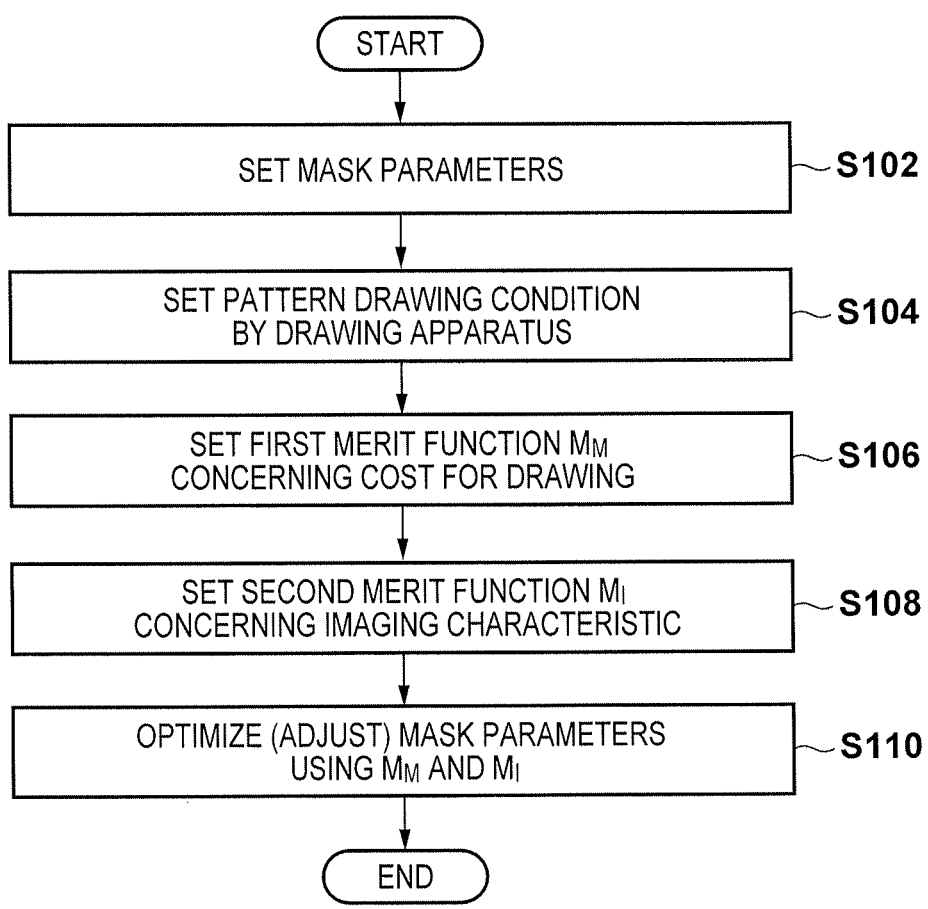
FIG. 1 is a flowchart showing a mask pattern determining method according to the first and third embodiments.

The embodiment of the present invention will be described below in more detail. FIG. 1 is a flowchart showing a mask pattern determining method according to the first embodiment of the present invention. This mask pattern determining method can be executed by the computer 100 in accordance with the pattern determining program 16.

Figure 2:
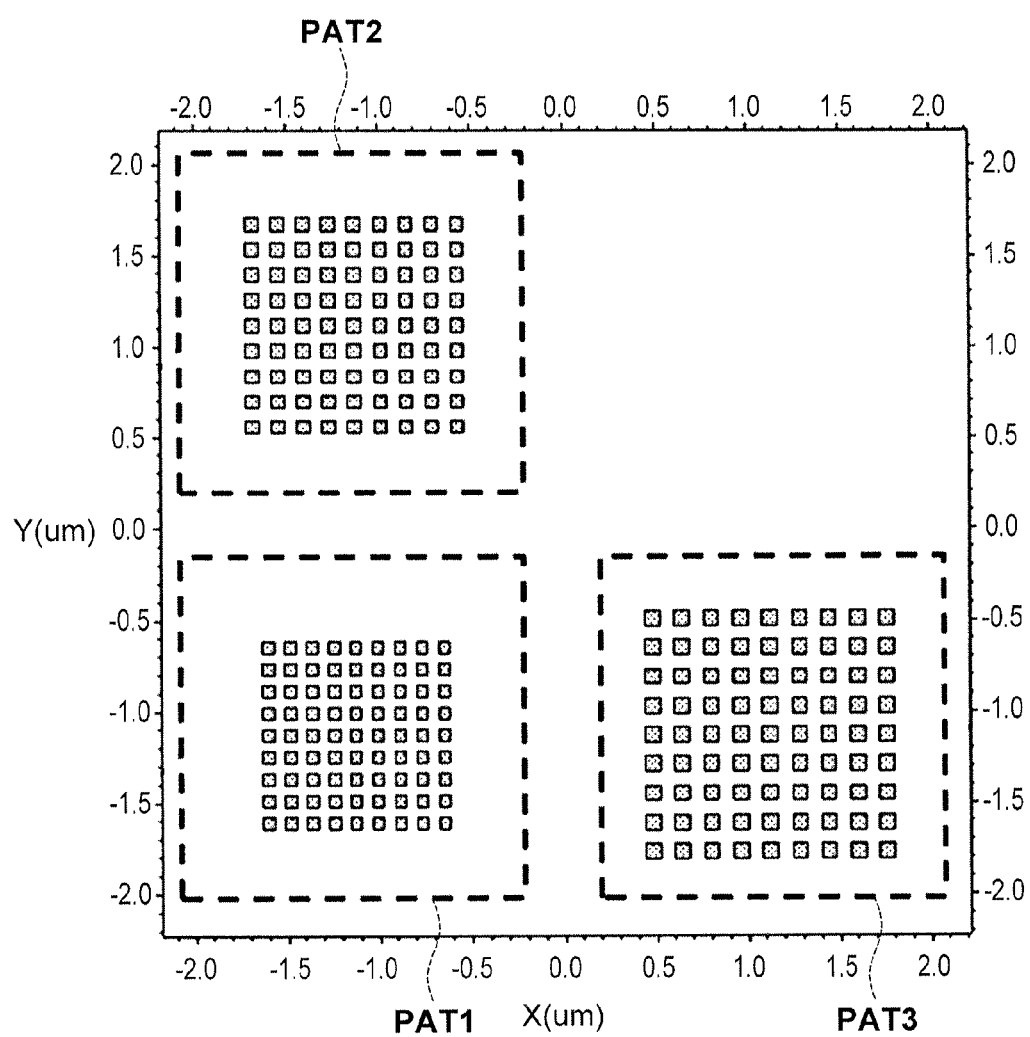
FIG. 2 is a view showing a pattern according to the first embodiment.

In step S102, the computer 100 sets parameters (mask parameters) for a pattern of the mask to be arranged on the object plane of the projection optical system of the exposure apparatus. Here, assume a pattern as shown in FIG. 2. The data of the pattern shown in FIG. 2 corresponds to the above-described pattern data 12. The pattern illustrated in FIG. 2 includes three types of hole pattern groups PAT1, PAT2, and PAT3. In step S102, the computer 100 sets mask parameters M1, M2, and M3 that define the shapes of the hole patterns PAT1, PAT2, and PAT3.

In the example to be explained in the first embodiment, the mask parameter M1 defines the size (horizontal width and vertical width) of the hole pattern group PAT1 having a pitch of 120 nm in both the X- and Y-directions. The mask parameter M2 defines the size (horizontal width and vertical width) of the hole pattern group PAT2 having a pitch of 140 nm in both the X- and Y-directions. The mask parameter M3 defines the size (horizontal width and vertical width) of the hole pattern group PAT3 having a pitch of 160 nm in both the X- and Y-directions. The mask parameters M1, M2, and M3 are given the following upper and lower limit values as constraint conditions to sufficiently maintain the generality:

$20 \leq M1 \leq 100$ (nm);

$25 \leq M2 \leq 105$ (nm); and $30 \leq M3 \leq 110$ (nm).

Note that FIG. 2 shows the size in the image of the pattern of the mask projected onto the substrate by the projection optical system for descriptive convenience. That is, the size on the object plane of the projection optical system is assumed to equal the size on the image plane of the projection optical system (that is, the magnification of the projection optical system is ×1). However, since the actual magnification of the projection optical system is often ×4 or ×5, the pattern of the mask needs to be set in consideration of the magnification of the projection optical system.

The pattern of the mask generally includes various patterns. In step S102, either mask parameters for all patterns included in the patterns of the mask or mask parameters for only some patterns may be set. In this example, the pattern of the mask is a hole pattern. However, it may be another pattern (e.g., a line pattern). The mask type is a binary mask. However, the mask type may be another type such as a phase shift mask.

In step S104, the computer 100 sets the drawing condition of the pattern on the mask blank by the drawing apparatus 200. In general, there can exist various drawing conditions (constraint conditions) according to the specifications of the drawing apparatus 200. The drawing conditions can include, for example, the size, position, shape, direction, and accuracy of a drawing shot. These drawing conditions will be explained below.

The drawing shot size will be described first. When drawing a pattern on a mask blank by a drawing apparatus, the drawing is sometimes preferably performed using a drawing shot of a specific size. Some drawing apparatuses can draw patterns using drawing shots of only one or a plurality of fixed sizes. Alternatively, even when a drawing apparatus capable of continuously changing the drawing shot size is used, the throughput may be improved by limiting the size of drawing shots to be used to a plurality of discrete sizes. Otherwise, when using a drawing apparatus that adjusts (conditions) of the dose, or the like, only for a drawing shot of a specific size, using only the drawing shot of the specific size can be required.

The drawing shot position is a position to be irradiated with a beam such as an electron beam. The throughput may be improved by limiting the drawing shot position on a grid defined in advance. Examples of the drawing shot shape are a rectangle, a triangle, and a circle. When a drawing shot has a linear shape, the drawing shot direction means a direction in which the linear shape extends. The drawing shot accuracy is an accuracy concerning the size, position, shape, direction, and the like, of a drawing shot.

To offer a more detailed example, the description will be continued assuming that a list of drawing shot sizes usable in the drawing apparatus 200 is given as a drawing condition in step S104, and only drawing shots of the sizes included in the list can be used. More specifically, five types of sizes, that is, 8 nm, 4 nm, 2 nm, 0.5 nm, and 0.1 mm in both the X- and Y-directions are usable as drawing shot sizes. In other words, only the drawing shots of the five types of sizes in both the X- and Y-directions are usable, and use of a total of twenty-five different drawing shots is permitted. Note that in step S104 as well, the drawing shot sizes usable by the drawing apparatus 200 are determined assuming that the magnification of the projection optical system is ×1 for the sake of simplicity, as in step S102.

In step S106, the computer 100 sets a first merit function $M_M$ serving as a first evaluation function used to evaluate the cost of drawing the pattern (provisional pattern) on the mask blank. The merit function is an evaluation function used to perform optimization calculation. When the value of the merit function meets the termination condition, the optimization calculation ends. The termination condition can be determined as the merit function having the minimum or maximum value. In this case, however, the optimization calculation may take a long time. Hence, the termination condition is preferably determined as meeting an allowable range or an allowable value.

In step S106, the computer 100 may set the first merit function $M_M$ based on, for example, the drawing condition set in step S104. To offer a more detailed example, the description will be continued assuming that the first merit function $M_M$ given by $$M_M = \sum_{X=1}^{3} \text{shot}(X) \qquad (1)$$

is set, where shot(X) (X=1, 2, 3) indicates the number of drawing shots necessary for drawing one hole pattern in each pattern group PATX (X=1, 2, 3) illustrated in FIG. 2. A detailed calculation example of equation (1) will be described later.

In step S108, the computer 100 sets a second merit function $M_I$ serving as a second evaluation function used to evaluate an image formed on the image plane of the projection optical system when the mask having the provisional pattern is arranged on the object plane of the projection optical system. Each of the pattern groups PAT1, PAT2, and PAT3 includes holes arrayed in nine rows×nine columns. In this example, a merit function for evaluating the image of the hole at the center (that is, the hole arranged on the fifth column of the fifth row) is set as the second merit function $M_I$. The target values of the widths of the images of the holes at the centers are set to 60 nm, 70 nm, and 80 nm for the pattern groups PAT1, PAT2, and PAT3, respectively. The absolute value of the difference between the size prediction value and the target value of each of the three holes in an exposure simulation (simulation to calculate the image to be formed on the image plane of the projection optical system) will be referred to as a line width error.

The definition of the second merit function $M_I$ in this example will be described. Exposure simulations are conducted under seven conditions (conditions 1 to 7) shown in FIG. 17, and line width errors are calculated. Condition 1 is the standard condition. In condition 2, the pattern size is increased by 0.5 nm (mask error). In condition 3, the pattern size is decreased by 0.5 nm (mask error). In condition 4, the focus position of the projection optical system is given an error of +40 nm (focus position error). In condition 5, the focus position of the projection optical system is given an error of −40 nm (focus position error). In condition 6, the exposure amount is given an error of +3% (exposure amount error). In condition 7, the exposure amount is given an error of −3% (exposure amount error). A total of twenty-one line width error values are calculated under these conditions, and the maximum (absolute) value out of them is defined as the value of the second merit function $M_I$.

The evaluation amounts of the imaging characteristics by the exposure simulations considering the mask errors (conditions 2 and 3), the focus position errors (conditions 4 and 5), and the exposure amount errors (conditions 6 and 7) can be called PV-Band (Process Variation Band). There are various evaluation methods using PV-Band. In this example, the maximum line width error value under all conditions is used. In some cases, not the line width error but an edge position error (to be referred to as an edge placement error) of the image is used. Instead of using the maximum error value under all conditions, a function for obtaining the sum of the absolute values of the error values under the respective conditions may be used as the merit function.

In this example, the merit function concerning the image performance is defined using PV-Band. However, another imaging characteristic index may be used. For example, DOF (Depth Of Focus), NILS (Normalized Image Log Slope), exposure latitude, MEEF (Mask Error Enhancement Factor), or the like, may be used.

In step S110 (optimization step), the computer 100 optimizes (adjusts) the mask parameter values set in step S102 using the values of the first merit function $M_M$ and the second merit function $M_I$. The optimization method (algorithm) is not limited to a specific algorithm, and any method is usable.

A detailed example of the processing in step S110 (optimization) will be described below with reference to FIG. 3. In step S1110 (changing step), the computer 100 adjusts (changes) the mask parameter values set in step S102. The initial mask parameter values can be determined based on a random number.

Figure 4:
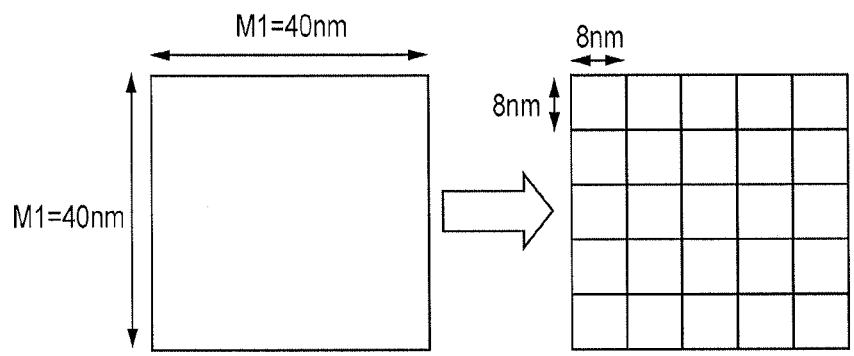
FIG. 4 is a view showing an example of a calculation of a first merit function $M_M$ serving as a first evaluation function used to evaluate the cost of drawing a pattern (provisional pattern) on a mask blank.

In step S1112 (first calculation step), the computer 100 calculates the value of the first merit function $M_M$ set in step S106 using the mask parameter values adjusted in step S1110 and the drawing condition by the drawing apparatus 200 set in step S104. The method of calculating the value of the first merit function $M_M$ will be described with reference to FIG. 4. Assume that M1=40 nm in step S1110. At this time, one hole pattern has a 40-nm square shape. To draw the square hole using a drawing shot size in the list of drawing shot sizes set in step S104, the drawing is performed twenty-five times using a drawing shot having a size of 8 nm×8 nm in the vertical and horizontal directions, as shown in FIG. 4. Hence, to draw one hole, twenty-five drawing shots are necessary. The pattern of the mask set in step S102 includes the hole patterns PAT2 and PAT3 as well. When the same calculation is performed for these hole patterns, the number of drawing shots, that is, the value of the first merit function $M_M$ necessary for each of the patterns PAT1, PAT2, and PAT3 can be calculated.

In step S1114 (second calculation step), the computer 100 calculates the value of the second merit function $M_I$ set in step S108. Here, as an example, the illumination shape is fixed, and the imaging performance of the projection optical system when a pattern adjusted (changed) using the illumination shape in step S1110 is arranged on the object plane of the projection optical system is evaluated. Such an exposure simulation can easily be conducted using a commercially available exposure simulator.

Figure 5:
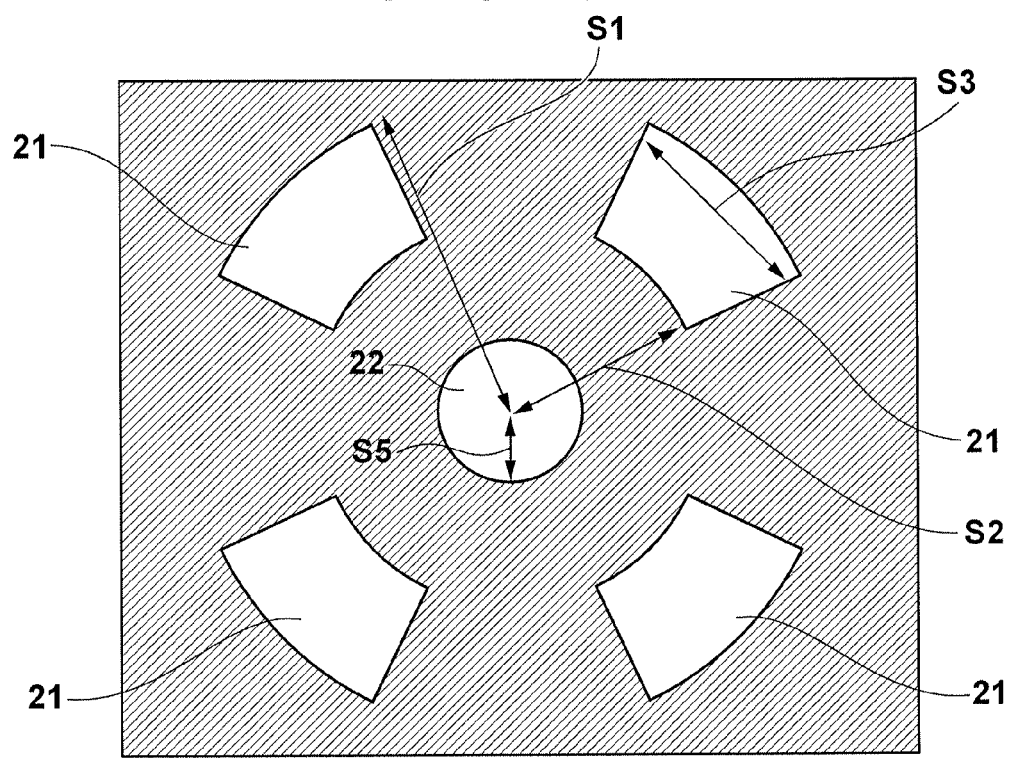
FIG. 5 is a view showing an illumination shape.

In this example, assume that an illumination (effective light source distribution) shown in FIG. 5 is used as an illumination condition when exposing a substrate in the lithography step of manufacturing a device such as a semiconductor device. The illumination shown in FIG. 5 has an illumination shape called a windmill shape, and includes quadrupole light emitting portions 21 and a circular light emitting portion 22. Each quadrupole light emitting portion 21 is defined by an outer sigma S1, an inner sigma S2, an angle S3, and a light emission intensity S4 (not illustrated in FIG. 5). The circular light emitting portion 22 is defined by a sigma S5 and a light emission intensity S6 (not illustrated in FIG. 5). The description will be made below assuming that the quadrupole light emitting portion is defined by S1=0.9, S2=0.54, S3=40°, S4=1, and the circular light emitting portion is defined by S5=0.2 and S6=0.6.

Note that an example will be described here in which a windmill-shaped illumination (effective light source distribution) is employed. However, the illumination shape is not limited to this, and any other shape such as an annular shape, a dipole shape, or a bull's-eye shape can be used. An illumination shape having a high degree of freedom may be set by, for example, dividing a light emitting portion into a grid.

In the first embodiment, an example will be described in which the mask parameter out of the mask parameter (pattern), the illumination condition of the exposure apparatus, and the drawing condition of the pattern for the mask blank is adjusted (changed) in step S1110 (changing step). However, the present invention is applicable to adjusting (changing) at least one of the mask parameter (pattern), the illumination condition of the exposure apparatus, and the drawing condition of the pattern for the mask blank in step S1110 (changing step). Note that in the second embodiment, an example will be described in which at least one of the mask parameter (pattern) and the illumination condition of the exposure apparatus is changed in step S1110 (changing step).

When conducting an exposure simulation, the exposure wavelength (λ), the numerical aperture (NA) of the projection optical system of the exposure apparatus, and the deflection state of the illumination of the exposure apparatus can be input to the simulator. In this example, λ=193 (nm), and NA=1.35. The deflection state is tangential deflection. Other than the items exemplified here, the three-dimensional structure of the mask, the aberration and flare of the projection optical system, the stacked layer structure of the resist, the resist model, and the like can be input. These items may be input (set) if necessary.

In step S1116 (judging step), the computer 100 judges whether to end the optimization step. When the calculation result in step S1112 and that in step S1114 meet the termination condition, the computer 100 judges to end the optimization step. The termination condition is that the first merit function $M_M$ meets a first standard, and the value of the second merit function $M_I$ meets a second standard. The optimization step may end when the calculation count in steps S1110, S1112, and S1114 has exceeded a predetermined count. In this case, the mask pattern determining method shown in FIGS. 1 and 2 needs to be re-executed after a condition (for example, illumination condition, first standard, or second standard) has been changed.

Upon judging in step S1116 that the calculation result in step S1112 and that in step S1114 do not meet the termination condition, the computer 100 executes steps S1110, S1112, and S1114 again. The computer 100 thus repetitively executes steps S1110, S1112, and S1114 until the termination condition is met.

In this example, the Nelder-Mead method is used as the algorithm of adjusting the mask parameter in step S1110 (changing step). However, any other method is usable.

Upon judging in step S1116 that the calculation result in step S1112 and that in step S1114 do not meet the termination condition, the latest (that is, immediately preceding) mask parameter value is set as the final mask parameter value. Determining the mask parameter value is equivalent to determining the mask pattern.

An optimization result in the above-described example will be shown below as Parameter Group 1.

(Parameter Group 1)
M1=59.5 (nm), M2=64.1 (nm), M3=73.1 (nm)
MI=2.99 (nm), MM=346

As Comparative Example 1, a result is obtained by performing optimization in consideration of neither the drawing condition by the drawing apparatus 200 nor the cost of drawing a mask, but only the imaging characteristic (evaluated by the second merit function $M_I$). That is, the result is obtained by performing optimization in consideration of only the second merit function $M_I$ in step S110 without performing steps S104 and S106 in the flowchart of FIG. 1. The mask parameter setting in step S102, the definition of the second merit function $M_I$ in step S108, the optimization algorithm in step S110, and the fixed illumination shape are the same as in the above-described calculation example of the first embodiment. This optimization result will be shown as Parameter Group 2.

(Parameter Group 2)
M1=63.6 (nm), M2=68.6 (nm), M3=78.3 (nm)
MI=2.79 (nm)

When the value MM is calculated in accordance with the optimization result, MM=486.

As is apparent from the optimization result obtained in the first embodiment, the value $M_M$, that is, the number of drawing shots necessary for drawing the pattern on the mask blank is much smaller than in the result of Comparative Example 1, although the value $M_I$, that is, the imaging characteristic hardly changes. Hence, using the determining method according to the first embodiment makes it possible to reduce the cost (for example, the number of drawing shots) of manufacturing a mask while almost preventing degradation in the yield rate concerning mask pattern transfer to a substrate in the exposure step.

The second embodiment of the present invention will be described below. In the first embodiment, the pattern of the mask is optimized while fixing the illumination condition (shape) of the exposure apparatus. However, this is merely one embodiment of the present invention, as described above. The present invention is applicable to adjusting (changing), that is, optimizing at least one of the mask parameter (pattern), the illumination condition of the exposure apparatus, and the drawing condition of the pattern for the mask blank, as described above. In the second embodiment, the mask parameter and the illumination condition are optimized while adjusting (changing) at least one of the mask parameter and the illumination condition in the changing step.

There exist needs for both optimization performed while fixing the exposure condition (illumination shape), as in the first embodiment, and optimization performed without fixing the exposure condition (illumination shape), as in the second embodiment. The pattern of the mask generally includes various patterns. An illumination shape to be used for a critical one of the patterns can be defined in advance. In this case, for example, to optimize only non-critical patterns, it may be necessary to fix the illumination shape in advance. As another example, when the illumination optical system of the exposure apparatus uses a DOE (Diffraction Optical Element), it is difficult to largely adjust the illumination shape, and the illumination shape needs to be fixed. In these cases, the optimization according to the first embodiment is effective.

On the other hand, the illumination shape can be adjusted using the zoom lens, the aperture, or the like, in the illumination optical system, and the illumination shape itself has a certain degree of freedom. In addition, exposure apparatuses including a mechanism capable of flexibly adjusting the illumination shape have recently been developed. There is also a demand for optimizing both the illumination shape and the pattern of the mask. In these cases, optimizing both the pattern of the mask and the exposure condition (illumination shape) as in the second embodiment is effective.

Figure 6:
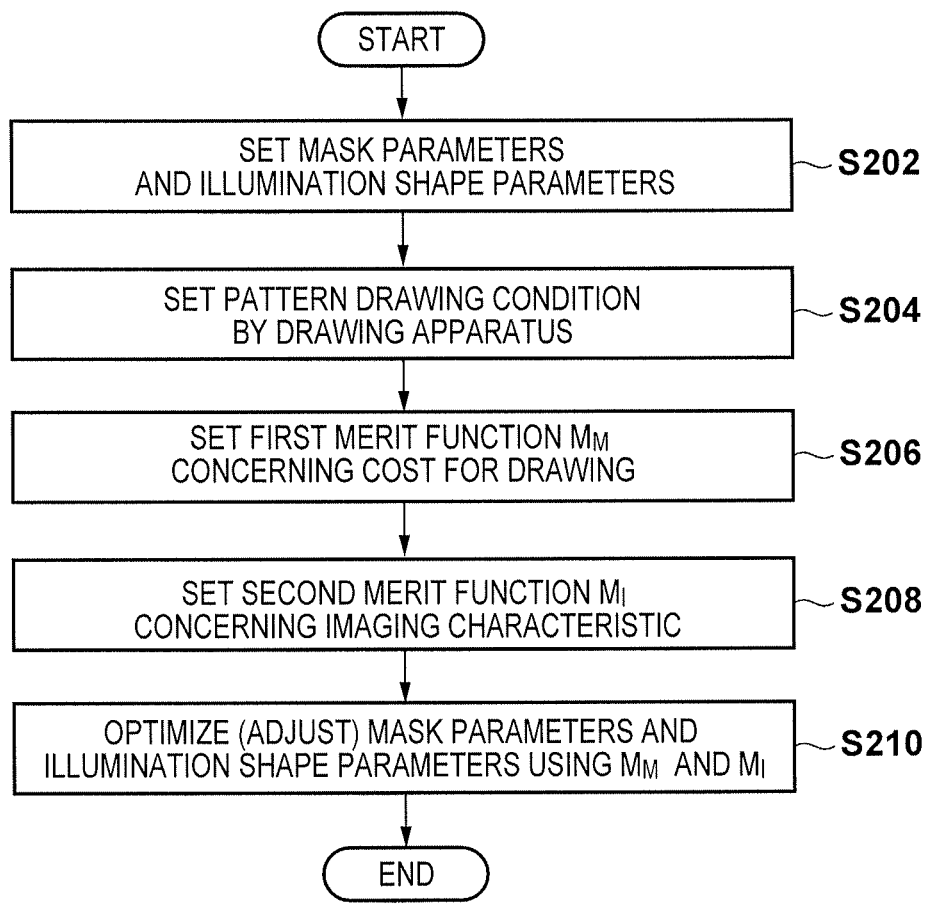
FIG. 6 is a flowchart showing a mask pattern determining method according to the second embodiment.

FIG. 6 is a flowchart showing a mask pattern determining method according to the second embodiment of the present invention. This mask pattern determining method can be executed by a computer 100 in accordance with a pattern determining program 16.

Figure 7:
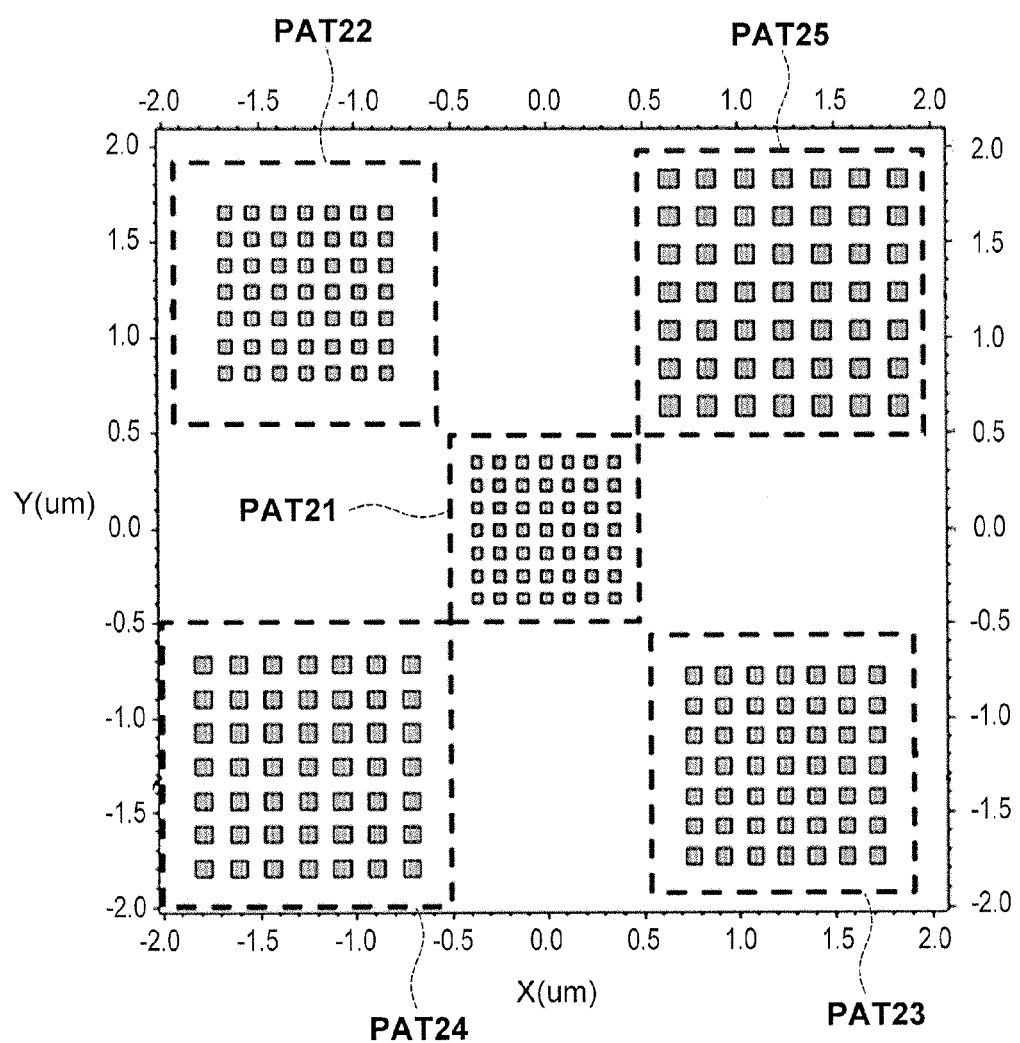
FIG. 7 is a view showing a pattern according to the second embodiment.

In step S202, the computer 100 sets parameters (mask parameters) for the pattern of the mask to be arranged on the object plane of the projection optical system of the exposure apparatus. Here, assume a pattern as shown in FIG. 7. The data of the pattern shown in FIG. 7 corresponds to pattern data 12 described above. The pattern illustrated in FIG. 7 is formed from light-shielding portions and transmitting portions, as in FIG. 2, and includes five types of patterns PAT21, PAT22, PAT23, PAT24, and PAT25. The patterns PAT21, PAT22, PAT23, PAT24, and PAT25 are densely packed hole patterns having pitches of 120 nm, 140 nm, 160 nm, 180 nm, and 200 nm, respectively, in both the X- and Y-directions. In this example, a mask parameter M1 defines the size (horizontal width and vertical width) of the pattern PAT21. Similarly, mask parameters M2, M3, M4, and M5 define the sizes (horizontal widths and vertical widths) of the patterns PAT22, PAT23, PAT24, and PAT25, respectively. The mask parameters M1, M2, M3, M4, and M5 are given the following upper and lower limit values as constraint conditions to sufficiently maintain the generality:

$20 \leq M1 \leq 100$ (nm);

$25 \leq M2 \leq 105$ (nm);

$30 \leq M3 \leq 110$ (nm);

$35 \leq M4 \leq 115$ (nm); and $40 \leq M5 \leq 120$ (nm).

In step S202, the computer 100 also sets an illumination shape parameter as illustrated in FIG. 5 as a parameter representing the exposure condition of the exposure apparatus.

That is, in the second embodiment, the illumination shape is defined by a windmill shape, and the illumination shape is defined using S1, S2, S3, S4, S5, and S6 as illumination shape parameters. Out of the illumination shape parameters, S1, S2, S3, and S4 represent the outer sigma, the inner sigma, the angle, and the intensity of a quadrupole portion, respectively. S5 and S6 represent the sigma and the intensity of a circular light emitting portion, respectively. Note that as for the values S4 and S6, the ratio (intensity ratio) thereof is important, and the magnitudes of the numerical values themselves have no significance. In other words, an exposure simulation obtained as a result in a case in which (S4, S6)=(1, 0.5) and that in a case in which (S4, S6)=(0.5, 0.25) are identical. Hence, at the time of optimization, even when a mediation parameter S7 is newly introduced and optimized under the following definition, the generality is not lost at all.

$0 \leq S7 \leq 1$ $S4 = S7$ $S6 = 1 - S7$

This illumination shape parameter setting represents a windmill shape, but also includes other illumination shapes such as an annular shape and a quadrupole shape, and the generality is not lost. Another illumination shape parameter setting method is also usable. In the first embodiment, all the illumination shape parameter values are defined (fixed), and the optimization calculation is then performed. In the second embodiment, the optimization calculation is performed by defining the respective illumination shape parameters as variables in the following way:

$0.5 \leq S1 \leq 0.98;$ $0.5 \leq S2 \leq 0.9;$ $0 \leq S3 \leq 90°;$ $0 \leq S5 \leq 0.5;$ and $0 \leq S7 \leq 1.$ Steps S204 and S206 are the same as steps S104 and S106 of the first embodiment.

In step S208, the computer 100 sets a second merit function $M_I$ serving as a second evaluation function used to evaluate an image formed on the image plane of the projection optical system when the mask having the provisional pattern is arranged on the object plane of the projection optical system. In this case, a merit function for evaluating DOF (Depth Of Focus) is set as the second merit function $M_I$. The second merit function $M_I$ for evaluating DOF will be exemplified.

The target values of the optical images (images formed on the image plane of the projection optical system) of the center hole of the pattern PAT21, the center hole of the pattern PAT22, the center hole of the pattern PAT23, the center hole of the pattern PAT24, and the center hole of the pattern PAT25 are set to 60 nm, 70 nm, 80 nm, 90 nm, and 100 nm (in both the vertical and horizontal directions), respectively. The exposure condition is set such that the line width of the optical image by the exposure simulation falls within the error range of ±10% of the target line width in the center hole patterns of all the patterns PAT21, PAT22, PAT23, PAT24, and PAT25. The exposure condition here means a combination of an exposure amount and a focus position. Such an exposure condition range is generally called a process window. Next, a focus position range where a common exposure amount margin of 10% or more can be obtained is determined in the process window. The focus position range is defined as the DOF in the second embodiment.

Figure 8:
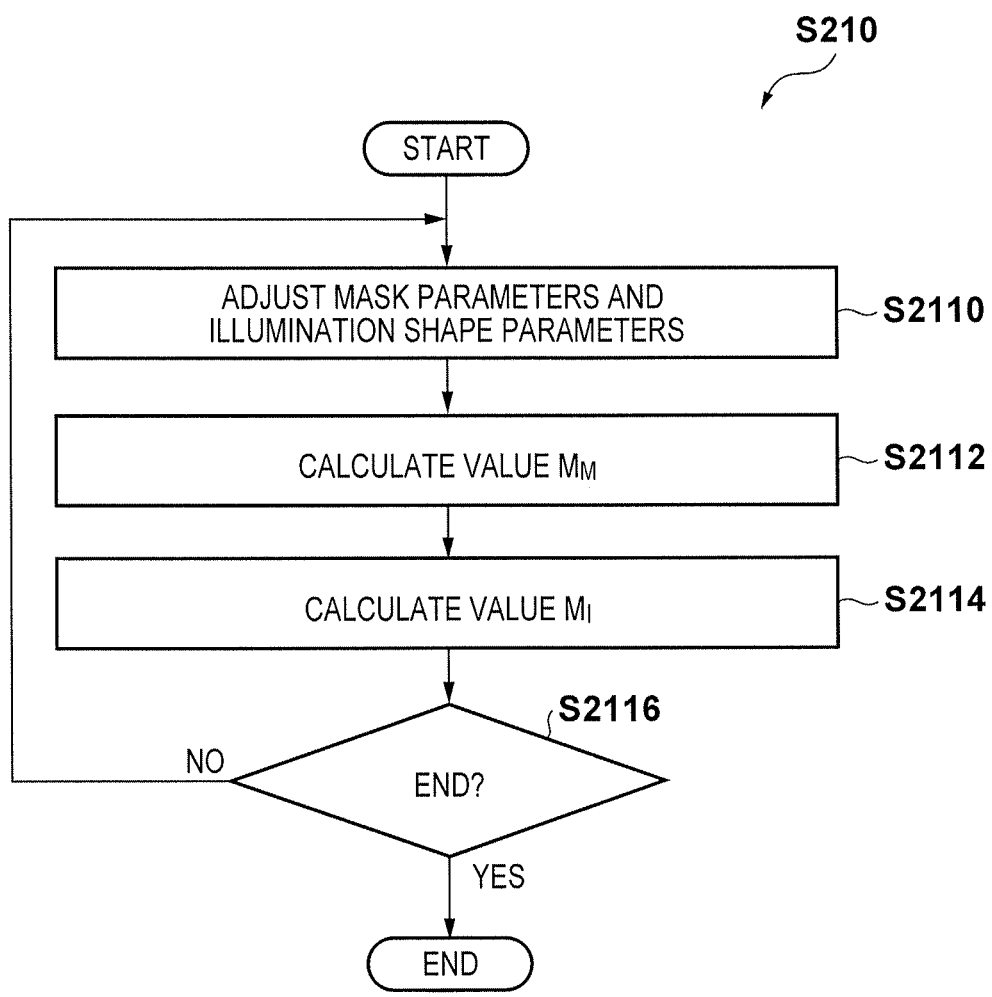
FIG. 8 is a flowchart showing a mask pattern determining method according to the second embodiment.

Step S210 is executed next to step S208. Processing in step S210 (optimization step) will be described below with reference to FIG. 8. In step S2110 (changing step), the computer 100 adjusts (changes) the mask parameter values and the illumination shape parameter values set in step S202. When executing step S2110 (changing step) once, at least one of the mask parameter value and the illumination shape parameter value can be adjusted (changed).

In step S2112 (first calculation step), the computer 100 calculates the value of a first merit function $M_M$ using the mask parameters and the illumination shape parameter values adjusted in step S2110 and the drawing condition by the drawing apparatus 200 set in step S204. In step S2114 (second calculation step), the computer 100 calculates the value of the second merit function $M_I$ set in step S208.

In step S2116 (judging step), the computer 100 judges whether to end the optimization step. When the calculation result in step S2112 and that in step S2114 meet the termination condition, the computer 100 judges to end the optimization step. The termination condition is that the first merit function $M_M$ meets a first standard, and the value of the second merit function $M_I$ meets a second standard.

An optimization result in the above-described example will be shown below as Parameter Group 3.
(Parameter Group 3)
M1=40.2 (nm), M2=45.5 (nm), M3=52.0 (nm), M4=59.0 (nm), M5=64.3 (nm)
S1=0.765, S2=0.625, S3=21.8°, S5=0.045, S7=0.641
$M_I$=235.1 (nm), MM=400

As Comparative Example 2, a result is obtained by performing optimization in consideration of neither the drawing condition by the drawing apparatus 200 nor the cost of drawing a mask, but only the imaging characteristic (evaluated by the second merit function $M_I$). That is, the result is obtained by performing optimization in consideration of only the second merit function $M_I$ in step S210 without performing steps S204 and S206 in the flowchart of FIG. 6. The mask parameter setting and illumination shape parameter setting in step S202, the definition of the second merit function MI in step S208, and the optimization algorithm in step S210 are the same as those in the above-described calculation example of the second embodiment. This optimization result will be shown as Parameter Group 4.
(Parameter Group 4)
M1=60.7 (nm), M2=70.6 (nm), M3=79.8 (nm), M4=90.2 (nm), M5=100.9 (nm)
S1=0.775, S2=0.643, S3=18.5°, S5=0.027, S7=0.736
$M_I$=250.9 (nm)
When the value $M_M$ is calculated in accordance with the optimization result, $M_M$=1074.

As is apparent from the optimization result obtained in the second embodiment, the number of shots of the mask drawing apparatus is much smaller than that in the result of Comparative Example 2, although the value $M_I$, that is, the imaging characteristic hardly changes. Hence, the present invention is useful even when optimizing not only the pattern of the mask but also the illumination shape, as in the second embodiment.

The third embodiment of the present invention will be described below. In the first and second embodiments, as the drawing condition by the drawing apparatus 200, a condition that shots of only a plurality of discrete sizes can be drawn has been considered. However, in the present invention, the drawing condition is not limited to this.

In the third embodiment, assume that a drawing apparatus 200 can draw a rectangle of an arbitrary (any) size by one shot. A computer 100 performs optimization in consideration of the number of rectangles included in a pattern of a mask. This can be said to be an example of optimization considering the complexity of a pattern of a mask.

In the third embodiment, a pattern called a serif is used. The serif is a kind of auxiliary pattern and is often used to increase the fidelity of a hole pattern. The serif is sometimes called a hammer head. Adding a serif pattern provides the ability to increase the fidelity of the image formed on the substrate. However, when a serif pattern is added, the pattern of the mask becomes complex, and the number of shots required at the time of reticle manufacturing increases, resulting in higher reticle cost. Hence, whether to add a serif pattern and the reticle cost have a tradeoff relationship. In the third embodiment, an optimum pattern of a mask is determined in consideration of the tradeoff as well.

Figure 9:
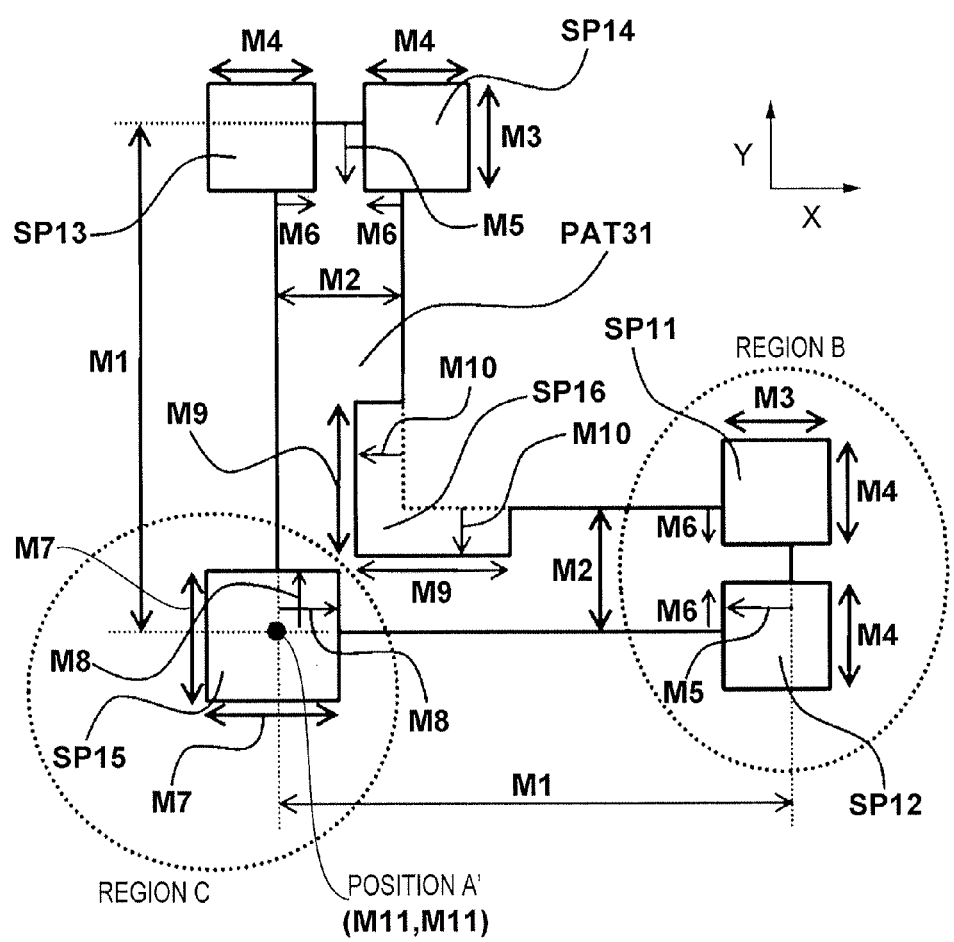
FIG. 9 is a view showing a pattern according to the third embodiment.
Figure 10:
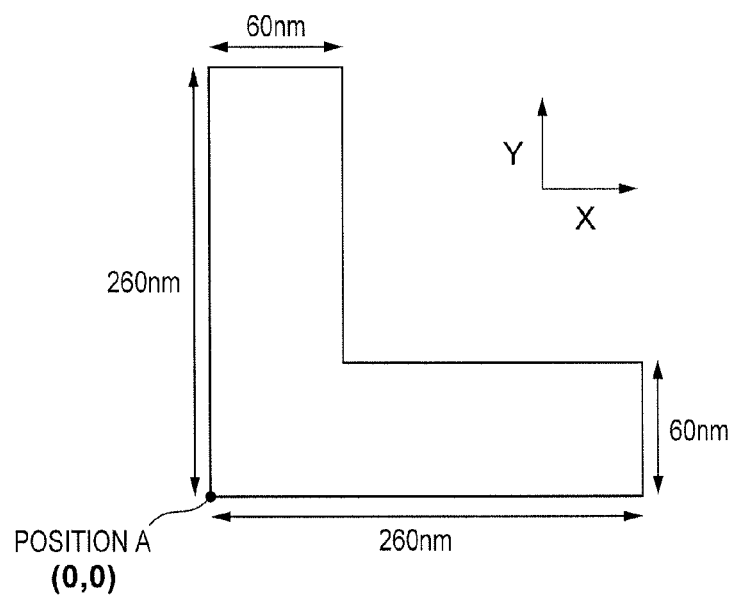
FIG. 10 is a view showing a target pattern according to the third embodiment.

A mask pattern determining method according to the third embodiment will be described with reference to FIG. 1 referred to in the description of the first embodiment. In step S102, the computer 100 sets parameters (mask parameters) for a pattern of the mask to be arranged on the object plane of the projection optical system of the exposure apparatus. In the third embodiment, the mask parameters are determined as shown in FIG. 9. FIG. 10 shows the target pattern of an optical image formed on the image plane of the projection optical system when the pattern of the mask shown in FIG. 9 is arranged on the object plane of the projection optical system. The target pattern shown in FIG. 10 is an L-shaped pattern, which is one of patterns often existing in a pattern for the metal process of a semiconductor logic circuit.

The pattern of the mask shown in FIG. 9 includes a main pattern PAT31 and serif patterns SP11, SP12, SP13, SP14, SP15, and SP16. Note that the pattern SP16 is not an additive pattern, but a subtractive auxiliary pattern, and therefore, is not called a serif pattern in some cases. In this specification, however, the pattern SP16 is also handled as a serif pattern for the sake of simplicity.

The mask parameters will be described with reference to FIG. 9. The X- and Y-direction sizes of the L-shaped main pattern PAT31 are defined using mask parameters M1 and M2. The serif pattern SP11 is defined by mask parameters M3, M4, M5, and M6. The mask parameters M3 and M4 define the length of one side (X- and Y-directions) of the serif pattern SP11. The mask parameters M5 and M6 define the degree of overlap between the serif pattern SP11 and the main pattern PAT31. The serif pattern SP12 is also defined using the same parameters. Note that since the main pattern is symmetrical in the X- and Y-directions, the serif patterns SP13 and SP14 can be defined in a similar manner.

The serif pattern SP15 is also defined using a mask parameter M7 that defines the size of the serif pattern and a mask parameter M8 that defines the degree of overlap between the serif pattern and the main pattern. The serif pattern SP16 is also defined using two mask parameters M9 and M10, as shown in FIG. 9.

Assume that the coordinates of a position A in FIG. 10 are (0, 0) and the coordinates of a position A' in FIG. 9 are (M11, M11). M11 also represents a mask parameter. That is, the pattern of the mask shown in FIG. 9 is shifted from the target pattern shown in FIG. 10 by M11 in both the X- and Y-directions as a whole.

Figure 11A:
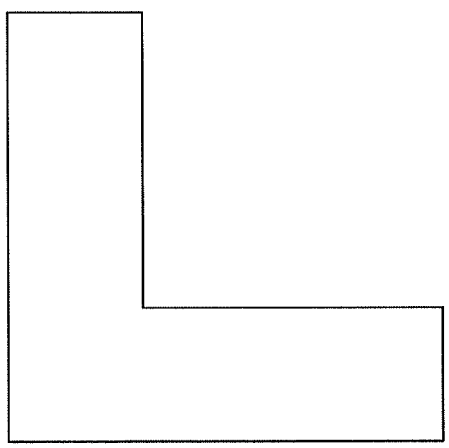
FIGS. 11A and 11B are views showing an example of a calculation of a first merit function $M_M$ serving as a first evaluation function used to evaluate the cost of drawing a pattern (provisional pattern) on a mask blank.
Figure 11B:
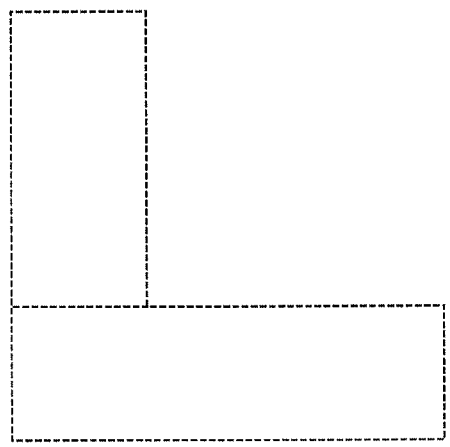

A method of calculating the number of drawing shots will be explained next. FIG. 11A illustrates a pattern of a mask without any serif pattern. In the third embodiment, to draw the pattern, it needs to be divided into two rectangular regions, as shown in FIG. 11B. In this case, the number of drawing shots is two. The number of drawing shots at this time will be referred to as the basic number of shots.

Figure 12A:
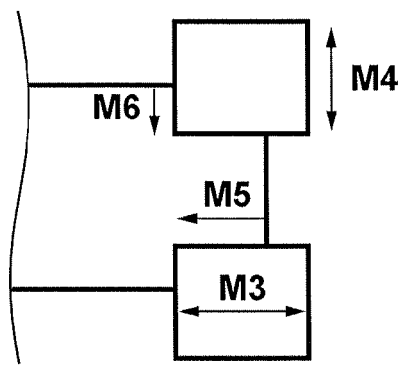
FIGS. 12A to 12F are views showing an example of a calculation of a first merit function $M_M$ serving as a first evaluation function used to evaluate the cost of drawing a pattern (provisional pattern) on a mask blank.
Figure 12B:
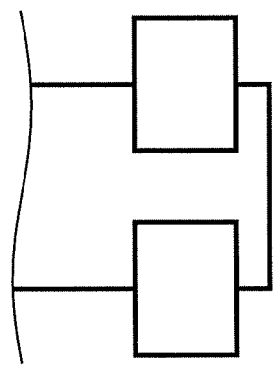
Figure 12C:
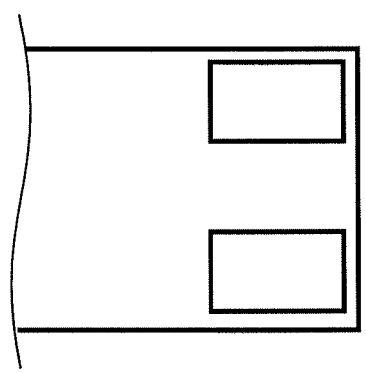
Figure 12D:
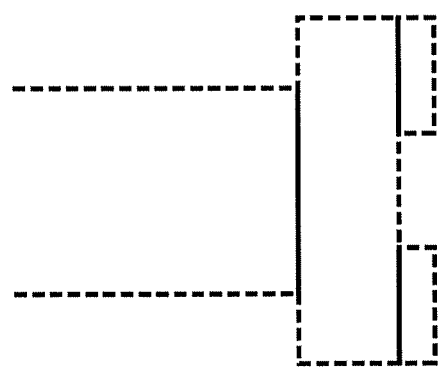
Figure 12E:
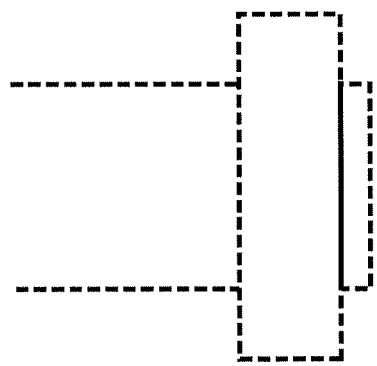
Figure 12F:
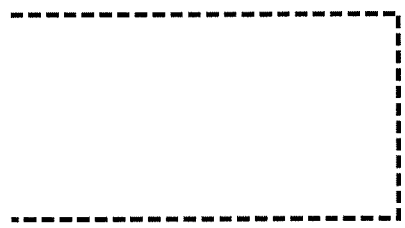

Since the pattern of the mask handled in the third embodiment includes serif patterns, a method of calculating the number of drawing shots of the pattern including serif patterns will be exemplified. In this case, comparison (magnitude relationship) of mask parameter values is important. FIGS. 12A to 12F are enlarged views of a region B shown in FIG. 9. As shown in FIGS. 12A to 12F, the pattern of the region B can take several shapes depending on the magnitude relationship of the mask parameters M3, M4, M5, and M6. For example, when M3>M5, and M4>M6, the pattern has a shape as shown in FIG. 12A. This pattern is divided into rectangular regions as shown in FIG. 12D. As can be seen, three new drawing shots are necessary in addition to the basic number of shots. When M3<M5, and M4>M6, the pattern has a shape as shown in FIG. 12B. This region is divided into rectangles as shown in FIG. 12E. As can be seen, two drawing shots are necessary in addition to the basic number of shots. On the other hand, when M3<M5, and M4<M6, the pattern has a shape as shown in FIG. 12C. The serif patterns completely fit in the main pattern. In this case, since the serif patterns need not be taken into consideration at the time of drawing, no new drawing shots are necessary in addition to the basic number of shots.

Figure 13A:
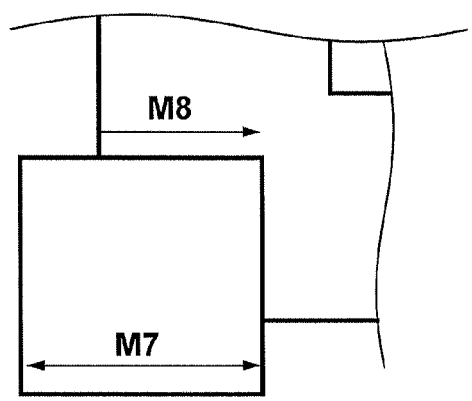
FIGS. 13A to 13D are views showing an example of a calculation of a first merit function $M_M$ serving as a first evaluation function used to evaluate the cost of drawing a pattern (provisional pattern) on a mask blank.
Figure 13B:
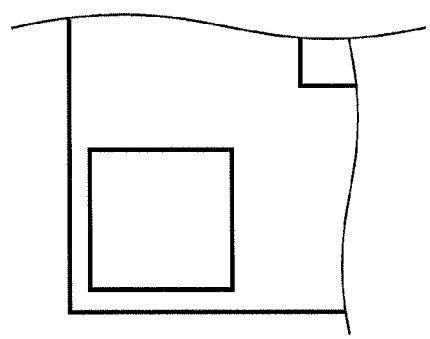
Figure 13C:
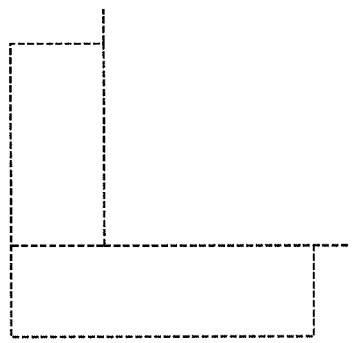
Figure 13D:
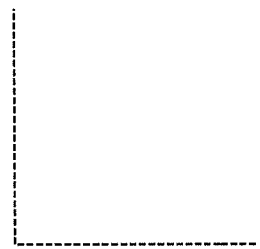

FIGS. 13A to 13D show a region C in FIG. 9. The serif pattern SP15 in the region C can be defined using the mask parameters M7 and M8. When M7>M8, the serif pattern is generated outside the main pattern, as shown in FIG. 13A. Hence, two drawing shots are necessary in addition to the basic number of shots, as shown in FIG. 13C. On the other hand, when M7<M8, the serif pattern fits in the main pattern, as shown in FIG. 13B. Hence, no new drawing shots are necessary in addition to the basic number of shots.

By the same method, the number of drawing shots can easily be calculated in the portions SP13, SP14, and SP16. As described above, when the mask parameters are set as in the third embodiment, the shape of the pattern of the mask can be known only by checking the large/small relationship between them. The number of shots necessary when drawing a pattern group including serif patterns can be described as a function of the mask parameters.

The mask pattern dividing method illustrated in FIGS. 11A and 11B, 12A to 12F, and 13A to 13D is merely an example of the dividing method capable of minimizing the total number of drawing shots, and other dividing methods are also present. In this embodiment, the number of drawing shots is calculated in accordance with the dividing method, for the sake of simplicity. To calculate the number of drawing shots by another dividing method, a drawing condition corresponding to it is set in step S104 of the third embodiment.

In step S104, the computer 100 sets the drawing condition of the pattern for the mask blank by the drawing apparatus 200. In the third embodiment, the computer 100 inputs a drawing condition that a rectangle is drawn by one drawing shot independently of its size.

In step S106, the computer 100 sets a first merit function $M_M$ serving as a first evaluation function used to evaluate the cost of drawing the pattern (provisional pattern) on the mask blank. In the third embodiment, the computer 100 sets the first merit function $M_M$ for calculating the number of drawing shots in accordance with the method described with reference to FIGS. 11A and 11B, 12A to 12F, and 13A to 13D. More specifically, the number of drawing shots necessary for drawing all of the main pattern PAT31 and the serif patterns SP11, SP12, SP13, SP14, SP15, and SP16 is set as $M_M$.

Figure 14:
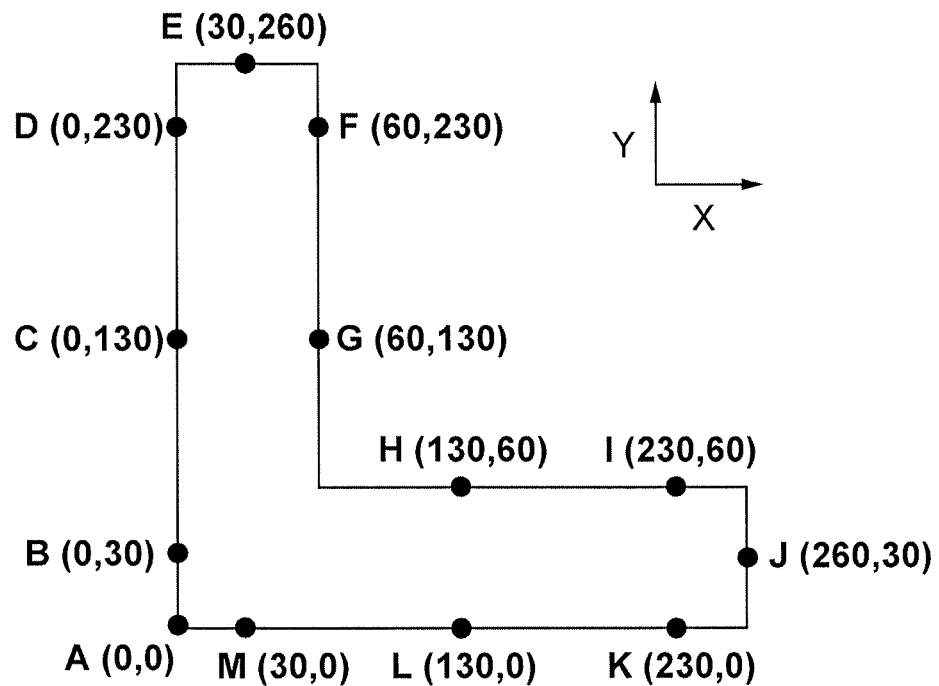
FIG. 14 is a view showing an example of a calculation of the value of a second merit function MI serving as a second evaluation function used to evaluate an imaging characteristic.

In step S108, the computer 100 sets a second merit function $M_I$ serving as a second evaluation function used to evaluate an image formed on the image plane of the projection optical system when the mask having the provisional pattern is arranged on the object plane of the projection optical system. In the third embodiment, an edge placement error at the best focus and a reference exposure amount is set as $M_I$ (nm). More specifically, a plurality of coordinate points of interest are set on the target pattern shown in FIG. 10. FIG. 14 exemplifies thirteen coordinate points of interest. The magnitude (nm) of the distance (shift) between the edge of the optical image and each coordinate point of interest will be referred to as an edge placement error. In the third embodiment, the maximum value (that is, worst value) of the thirteen edge placement errors is defined as $M_I$ (nm).

Figure 3:
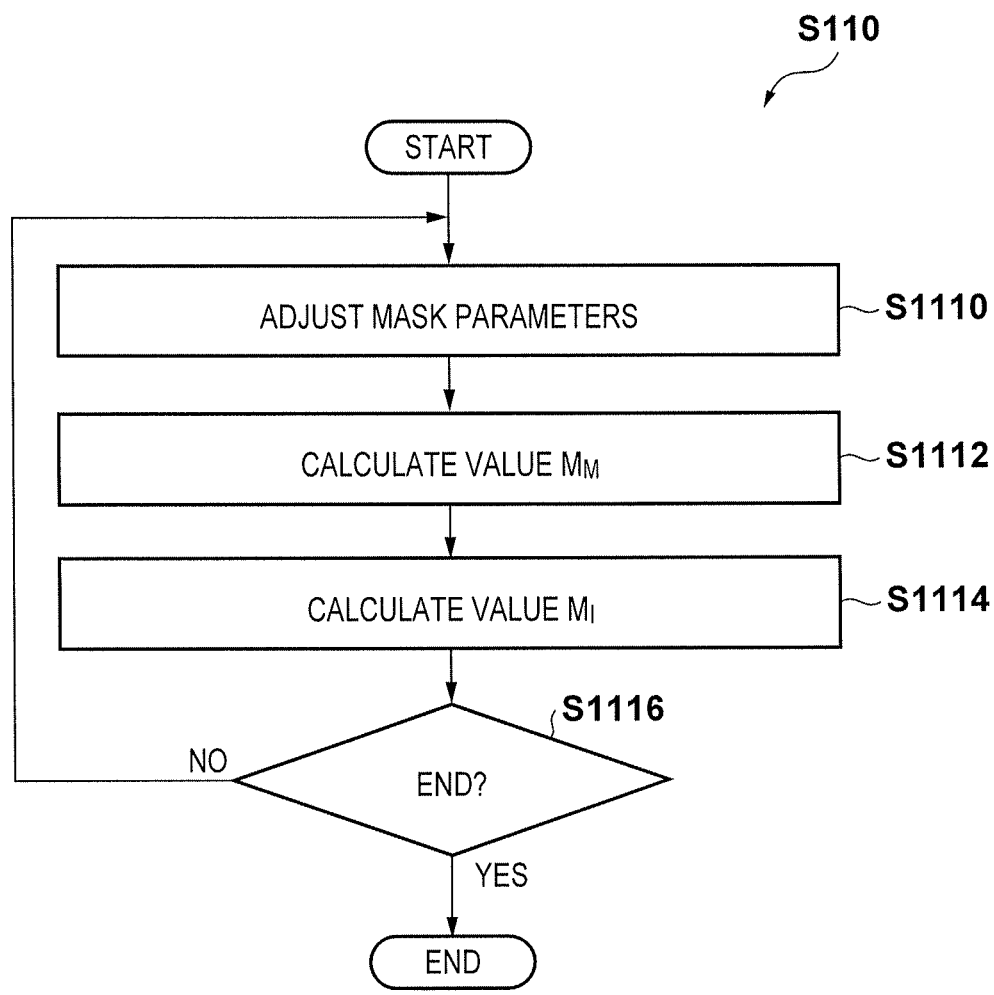
FIG. 3 is a flowchart showing a mask pattern determining method according to the first and third embodiments.
Figure 15:
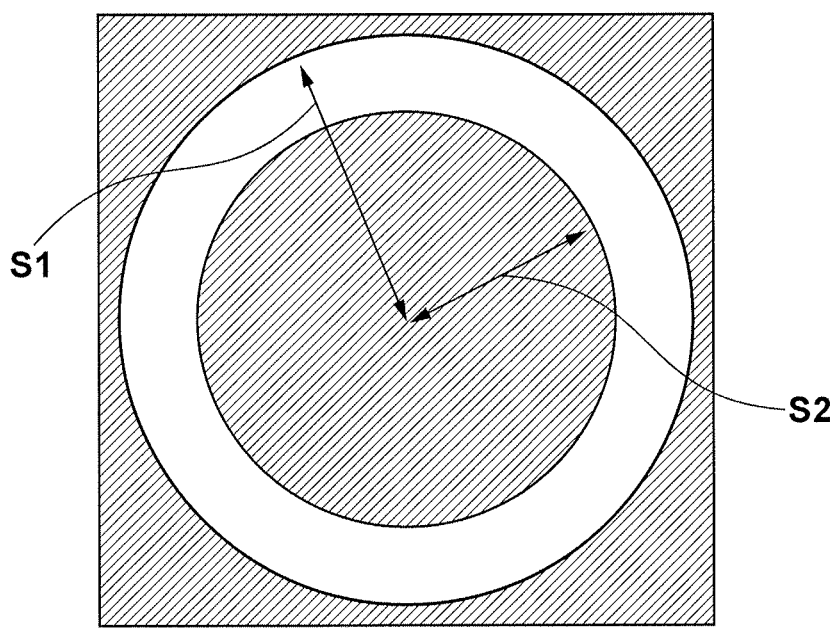
FIG. 15 is a view showing an illumination shape.

Processing in step S110 (optimization step) is the same in the flowchart of FIG. 3 that illustrates the details of the processing. In the third embodiment, the illumination shape at the time of an exposure simulation is fixed to an annular illumination shape shown in FIG. 15. The prescribed values (fixed values) of the illumination shape parameters are S1=0.9, and S2=0.72. An obtained optimization result will be shown below as Parameter Group 5.

(Parameter Group 5)
M1=265.0 (nm), M2=51.1 (nm), M3=26.1 (nm), M4=45.6 (nm), M5=26.1 (nm), M6=6.6 (nm),
M7=51.2 (nm), M8=7.5 (nm), M9=50.1 (nm), M10=11.7 (nm), M11=3.6 (nm)
MI=0.41 (nm), MM=10

As Comparative Example 3, a result is obtained by performing optimization in consideration of neither the drawing condition by the drawing apparatus 200 nor the cost of drawing a mask, but only the imaging characteristic (evaluated by the second merit function $M_I$). That is, the result is obtained by performing optimization in consideration of only the second merit function $M_I$ in step S110 without performing steps S104 and S106 in the flowchart of FIG. 1. The mask parameter setting in step S102, the definition of the second merit function $M_I$ in step S108, the optimization algorithm in step S110, and the fixed illumination shape are the same as in the above-described calculation example of the third embodiment. This optimization result will be shown as Parameter Group 6.

(Parameter Group 6)
M1=253.8 (nm), M2=51.1 (nm), M3=39.9 (nm), M4=37.8 (nm), M5=21.0 (nm), M6=11.4 (nm),
M7=50.7 (nm), M8=8.2 (nm), M9=47.0 (nm), M10=11.8 (nm), M11=3.7 (nm),
MI=0.28 (nm)

When the value $M_M$ is calculated in accordance with the optimization result, $M_M$=12.

As is apparent from the optimization result obtained in the third embodiment, the value $M_M$, that is, the number of drawing shots necessary for drawing the pattern on the mask blank is much smaller than that in the result of Comparative Example 3, although the value $M_I$, that is, the imaging characteristic hardly changes. In the example described here, the pattern of the mask includes only one main pattern, and the number of drawing shots is decreased by two. On an actual mask, an enormous number of types of patterns coexists, and a larger effect can be obtained.

The fourth embodiment of the present invention will be described below. In the fourth embodiment, the present invention is applied to a technique of improving drawing performance using a pattern called SRAF (Sub-Resolution Assist Feature) not to be resolved. For example, in step S102 of the flowchart in FIG. 1, mask parameters can be set for a pattern (that is, SRAF) not to be resolved, which is arranged in addition to a pattern to be resolved. This provides the ability to optimize the mask parameters of the SRAF, for example, the size and position of the SRAF as well.

The fifth embodiment of the present invention will be described below. In the first and second embodiments, as the drawing condition by the drawing apparatus 200, the sizes of drawing shots that can be drawn are set in the form of a numerical value list. However, the present invention is not limited to this. As another example of the drawing condition, a drawing condition for a mask shape can be used. A recent drawing apparatus can draw not only a rectangular pattern (0° and 90° directions), but also a pattern having a shape in the 45° direction. A drawing apparatus capable of finer angle control is also present. There also exists a drawing apparatus called character projection, which has an aperture of a specific shape (not always rectangular or triangular) and can draw a mask pattern of the aperture shape. Data about such a shape characteristic or angle characteristic may be input.

As still another example, a condition for the position (coordinates) of mask drawing can also be considered as the drawing condition by a drawing apparatus 200. The drawing apparatus 200 adjusts a point to be irradiated with an electron beam by moving, in the X- and Y-directions, the substrate stage on which the substrate is placed or deflecting the electron beam using an electron lens. Since a higher efficiency can generally be attained by setting a drawing shot position in an integer multiple of a specific discrete value (grid), the position to draw a pattern may have a specific discrete value. Hence, data about the position to draw a pattern can also be given as a drawing condition.

As yet another example, the accuracy of the size and position of a pattern to be drawn by the drawing apparatus 200 is limited, and allowing an error of a predetermined amount is sometimes unavoidable. The error value can also be considered as an example of the drawing condition. Giving error data provides the ability to determine the pattern of the mask in consideration of the error. Any condition other than those described above can be used as the drawing condition by the drawing apparatus 200. A data group about a plurality of drawing conditions may be input.

The sixth embodiment of the present invention will be described below. In the first to third embodiments, the merit function for evaluating the cost of drawing a pattern on a mask blank to manufacture a mask is a merit function for evaluating the number of drawing shots. However, the present invention is not limited to this.

For example, a function for giving the minimum value of the drawing shot size may be used as the merit function. In general, the larger the drawing shot size of a mask is, the larger the adjustment unit (also called a grid) of the aperture of the drawing apparatus can be made. This may lead to improvement of throughput. That is, when a function for giving the minimum value of the shot size is used as the merit function, the cost of drawing a pattern on a mask blank to manufacture a mask can be minimized by maximizing the value of the function.

As another example, a function for giving the number of drawing shot size types to be used in drawing by a drawing apparatus 200 may be used as the merit function. The time required for drawing the unit number of drawing shots may shorten because, for example, the compression and data processing time for a data amount necessary for the operation of the drawing apparatus 200 can be shortened as the number of drawing shots of the same size increases. Hence, when this number is used as the merit function, the mask manufacturing can efficiently be maximized by minimizing the value of the function.

As still another example, the maximum value of the shot size may be set, or the difference between the maximum value and the minimum value of the drawing shot size may be set. That is, any evaluation criterion can be set as long as it concerns the cost of drawing a pattern on a mask blank to manufacture a mask.

The merit function concerning the cost of drawing a pattern on a mask blank to manufacture a mask may be a function that combines a plurality of evaluation criteria concerning the cost of drawing a pattern on a mask blank to manufacture a mask. For example, to consider both the number of drawing shots and the minimum value of the drawing shot size, a value obtained by weighting the two values and adding them may be set as the merit function.

As described above, the merit function concerning the cost of drawing a pattern on a mask blank to manufacture a mask can be modified to any form in accordance with the needs of the user who wants to determine the pattern of the mask.

The seventh embodiment of the present invention will be described below. In the seventh embodiment, a plurality of drawing conditions are compared, and the most preferable drawing condition is selected from them. In a drawing apparatus, a plurality of drawing modes may be prepared in advance. Alternatively, a case in which a plurality of drawing modes are defined by the user who uses the drawing apparatus is also assumable. For example, a plurality of drawing modes may be prepared in advance, including a drawing mode in which a high drawing accuracy trades away for the throughput, and a drawing mode in which a high throughput trades away for the accuracy. The drawing conditions such as the size, position, accuracy, and shape in each mode are set. As a function of these drawing conditions, a merit function concerning the cost of drawing a pattern on a mask blank to manufacture a mask can be set. This makes it possible to determine a drawing condition capable of most reducing the cost in consideration of the plurality of drawing modes.

Even when the user owns a plurality of drawing apparatuses, which drawing apparatus can optimally be used can be known by using the same method as described above. In general, the more sophisticated the latest drawing apparatus is, the higher the throughput is, but the higher the operation and maintenance costs of the drawing apparatus tend to be. These points are also reflected on the mask cost. If it becomes known that using the technique described in the seventh embodiment enables even an old drawing apparatus to manufacture a mask conventionally manufactured only by using a latest drawing apparatus, the mask cost can be reduced, resulting in a large advantage for the user.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of determining a pattern of a mask to be used in an exposure apparatus that includes a projection optical system, wherein the mask is arranged on an object plane of the projection optical system, the method comprising the following steps being executed by a computer:
   a first calculation step of calculating a value of a first evaluation function used to evaluate a cost of drawing a provisional pattern on a mask blank to manufacture the mask;
   a second calculation step of calculating a value of a second evaluation function used to evaluate an image of the provisional pattern, which is formed on an image plane of the projection optical system when a mask having the provisional pattern is arranged on the object plane of the projection optical system; and
   a changing step of changing the provisional pattern,
   wherein the first calculation step and the second calculation step are repeated via the changing step, and the provisional pattern is determined as the pattern of the mask, in a case that the value of the first evaluation function calculated in the first calculation step meets a first predetermined standard and the value of the second evaluation function calculated in the second calculation step meets a second predetermined standard.

2. The method according to claim 1, wherein, in the first calculation step, the value of the first evaluation function is calculated based on a drawing condition of a pattern for the mask blank.

3. The method according to claim 2, wherein the drawing condition includes at least one of a size of a drawing shot, a position to draw a pattern, a shape of a drawing shot, a direction to draw a pattern, and an accuracy to draw a pattern.

4. The method according to claim 2, wherein the changing step includes changing the drawing condition, and the drawing condition is determined for drawing the determined pattern on the mask blank, in a case that the value of the first evaluation function calculated in the first calculation step meets the first predetermined standard and the value of the second evaluation function calculated in the second calculation step meets the second predetermined standard.

5. The method according to claim 1, wherein the changing step includes changing an illumination condition for illuminating the mask having the provisional pattern, wherein the latest provisional pattern is determined as the mask pattern, and a latest illumination condition is determined for exposing a substrate using the determined pattern of the mask, in a case that the value of the first evaluation function calculated in the first calculation step meets the first predetermined standard and the value of the second evaluation function calculated in the second calculation step meets the second predetermined standard.

6. The method according to claim 1, wherein the cost includes the number of drawing shots necessary for drawing the pattern on the mask blank.

7. The method according to claim 1, wherein the cost includes at least one of a drawing time necessary for drawing the pattern on the mask blank, a minimum or maximum value of drawing shot sizes, and the number of drawing shot size types.

8. A non-transitory computer-readable storage medium storing a program that causes a computer to execute a method of determining a pattern of a mask to be used in an exposure apparatus that includes a projection optical system, wherein the mask is arranged on an object plane of the projection optical system, the method comprising:
   a first calculation step of calculating a value of a first evaluation function used to evaluate a cost of drawing a provisional pattern on a mask blank to manufacture the mask;
   a second calculation step of calculating a value of a second evaluation function used to evaluate an image of the provisional pattern, which is formed on an image plane of the projection optical system when a mask having the provisional pattern is arranged on the object plane of the projection optical system; and
   a changing step of changing the provisional pattern, wherein the first calculation step and the second calculation step are repeated via the changing step, and the provisional pattern is determined as the pattern of the mask, in a case that the value of the first evaluation function calculated in the first calculation step meets a first predetermined standard and the value of the second evaluation function calculated in the second calculation step meets a second predetermined standard.

9. A pattern determining apparatus for determining a pattern of a mask to be used in an exposure apparatus that includes a projection optical system, wherein the mask is arranged on an object plane of the projection optical system, that apparatus comprising:

a first calculation unit configured to calculate a value of a first evaluation function used to evaluate a cost of drawing a provisional pattern on a mask blank to manufacture the mask;

a second calculation unit configured to calculate a value of a second evaluation function used to evaluate an image of the provisional pattern, which is formed on an image plane of the projection optical system when a mask having the provisional pattern is arranged on the object plane of the projection optical system; and a changing unit configured to change the provisional pattern, wherein the calculations by the first calculation unit and the second calculation unit are repeated via the changing by the changing unit, and the provisional pattern is determined as the pattern of the mask, in a case that the value of the first evaluation function calculated by the first calculation unit meets a first predetermined standard and the value of the second evaluation function calculated by the second calculation unit meets a second predetermined standard.

* * * * *